(12) United States Patent
Womac

(10) Patent No.: US 7,319,849 B2
(45) Date of Patent: Jan. 15, 2008

(54) RADIO-FREQUENCY TUNER WITH DIFFERENTIAL CONVERTER

(75) Inventor: Michael D. Womac, McKinney, TX (US)

(73) Assignee: Microtune (Texas), L.P., Allen, TX (US)

( * ) Notice: Subject to any disclaimer, the term of this patent is extended or adjusted under 35 U.S.C. 154(b) by 177 days.

(21) Appl. No.: 11/211,969

(22) Filed: Aug. 25, 2005

(65) Prior Publication Data

US 2007/0049224 A1 Mar. 1, 2007

(51) Int. Cl.
*H04B 7/00* (2006.01)

(52) U.S. Cl. ............... 455/180.1; 455/318; 455/191.3; 375/349; 375/347

(58) Field of Classification Search ............ 455/193.1, 455/189.1, 179.1, 191.1, 168.1, 176.1, 273, 455/258, 275, 334, 318, 456.6, 561, 165.1, 455/209, 190.1, 192.1, 180.1, 180.2, 276.1, 455/277.1, 313, 424, 425, 255, 550.1, 575.1, 455/272, 326, 183.1, 86, 150.1, 207, 280, 455/456.5, 552.1, 562.1, 315, 292, 133; 348/731, 733, 725, 736; 343/751, 853, 893; 330/126, 258; 333/132, 133, 193, 195; 375/346, 376, 267, 349, 347, 259, 318, 338–339, 375/377; 342/357.09, 357.1, 423, 444, 417
See application file for complete search history.

(56) References Cited

U.S. PATENT DOCUMENTS

| 5,212,828 | A | * | 5/1993 | Hatashita et al. | ............ 455/295 |
| 5,896,562 | A | * | 4/1999 | Heinonen | ............... 455/76 |
| 5,966,666 | A | * | 10/1999 | Yamaguchi et al. | ..... 455/552.1 |
| 6,021,323 | A | * | 2/2000 | Vagher | ................. 455/324 |
| 6,351,236 | B1 | * | 2/2002 | Hasler | ............... 342/357.09 |
| 6,850,746 | B1 | * | 2/2005 | Lloyd et al. | ................ 455/272 |

(Continued)

FOREIGN PATENT DOCUMENTS

JP 2001-004744 * 1/2001

OTHER PUBLICATIONS

PCT Notification of Transmittal of the International Search Report and the Written Opinion of the International Searching Authority, or the Declaration in International Application No. PCT/US06/33573, dated May 18, 2007, 11 pages.

*Primary Examiner*—Edward F. Urban
*Assistant Examiner*—Charles Chow
(74) *Attorney, Agent, or Firm*—Baker Botts L.L.P.

(57) ABSTRACT

A system for tuning a radio-frequency signal includes a first input path, a second input path, a common reference generator, a selector, a mixer, and a filter. The first input path and the second input path propagate a first single-ended input signal and a second single-ended input signal, respectively, to the selector. The selector converts the first single-ended input signal and the second single-ended input signal into a first differential input signal and a second differential input signal, respectively, using a reference signal generated by the common reference generator.

The selector selectively couples one of the first and the second input path to an input of the mixer. The mixer downconverts a selected on of the differential input signals received from the selector. The filter attenuates a portion of the downconverted input signal outside a passband associated with the filter.

24 Claims, 4 Drawing Sheets

U.S. PATENT DOCUMENTS

| | | | |
|---|---|---|---|
| 2004/0130392 A1* | 7/2004 | Saito | 330/126 |
| 2005/0024544 A1* | 2/2005 | Waight et al. | 348/731 |
| 2005/0085206 A1* | 4/2005 | Lee et al. | 455/255 |
| 2005/0136857 A1 | 6/2005 | Yamamoto et al. | 455/101 |
| 2005/0193419 A1* | 9/2005 | Lindstrom et al. | 725/71 |
| 2005/0239417 A1* | 10/2005 | Boos | 455/86 |
| 2006/0052131 A1* | 3/2006 | Ichihara | 455/552.1 |
| 2006/0118976 A1* | 6/2006 | Hoffman | 261/24 |
| 2006/0194606 A1* | 8/2006 | Furuya et al. | 455/550.1 |

* cited by examiner

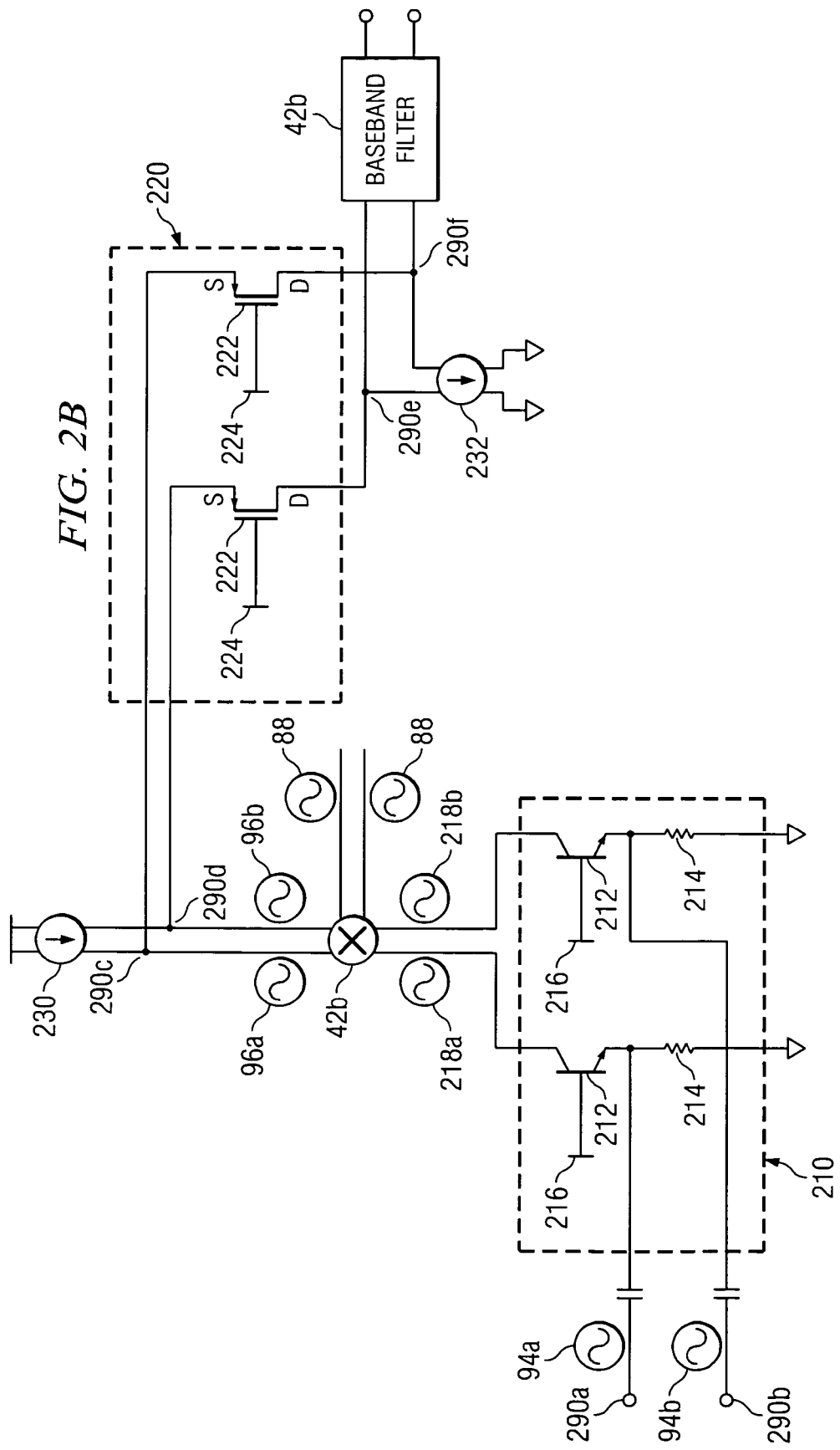

RADIO-FREQUENCY TUNER WITH DIFFERENTIAL CONVERTER

TECHNICAL FIELD OF THE INVENTION

This invention relates in general to radio-frequency signal tuners and, more particularly, to a multi-band digital broadcast tuner.

BACKGROUND OF THE INVENTION

Recent developments in communication technology have led to the introduction of mobile digital communication devices that provide several different types of service. As a result, modern communication devices may be faced with the task of receiving and processing a variety of different types of signals. This flexibility may provide significant design challenges when combined with the space and power restrictions associated with mobile devices.

In particular, receivers that can tune across multiple sub-bands of the radio-frequency spectrum, including sub-bands of different sizes, can be difficult to design. Designing a receiver to accept signals within multiple sub-bands of varying sizes may compromise the receiver's performance when receiving signals in some or all of the sub-bands. Both linearity and noise characteristics may be sacrificed to provide frequency flexibility. Furthermore, the power limitations faced by mobile devices result in headroom requirements for such devices that create additional design challenges.

SUMMARY OF THE INVENTION

In accordance with the present invention, the disadvantages and problems associated with signal tuners have been substantially reduced or eliminated. In particular, a multi-band broadcast tuner is provided.

In accordance with one embodiment of the present invention, a system for tuning a radio-frequency signal includes a first input path, a second input path, a common reference generator, a selector, a mixer, and a filter. The first input path and the second input path propagate a first single-ended input signal and a second single-ended input signal, respectively, to the selector. The selector converts the first single-ended input signal and the second single-ended input signal into a first differential input signal and a second differential input signal, respectively, using a reference signal generated by the common reference generator.

The selector selectively couples one of the first and the second input path to an input of the mixer. The mixer downconverts a selected on of the differential input signals received from the selector. The filter attenuates a portion of the downconverted input signal outside a passband associated with the filter.

In accordance with another embodiment of the present invention, a system for receiving radio-frequency signals includes a conductive path, an oscillator, a tuning path, and a mixer. The conductive path is capable of coupling an input signal to a signal input of the mixer. The input signal is associated with one or more frequencies within a first range of frequencies. The oscillator is capable of generating an oscillator signal that is associated with a frequency within a second range of frequencies. The tuning path is capable of coupling the oscillator signal to a tuning input of the mixer and the tuning path crosses the conductive path at least at a first point.

Additionally, the frequency divider is located on the tuning path between the first point and the tuning input of the mixer and is capable of generating a divided oscillator signal based on the oscillator signal. The divided oscillator signal is associated with a frequency within the first range of frequencies. Furthermore, the mixer is capable of receiving, at the signal input of the mixer, the input signal from the conductive path and receiving, at the tuning input of the mixer, the divided oscillator signal from the tuning path. The mixer is also capable of downconverting the input signal based on the divided oscillator signal and outputting at least a portion of the downconverted input signal.

Important technical advantages of certain embodiments of the present invention include power saving benefits, space-saving packaging, and greater operational flexibility. In particular, certain embodiments may be capable of operating with reduced headroom. Additionally, certain embodiments may be able to isolate internal signals from one another in an improved manner so as to provide greater noise-reduction. Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which:

FIGS. 2A and 2B are detailed illustrations of portions of a baseband stage that may be included in particular embodiments of the multi-band tuner.

DETAILED DESCRIPTION OF THE INVENTION

Figure 1:
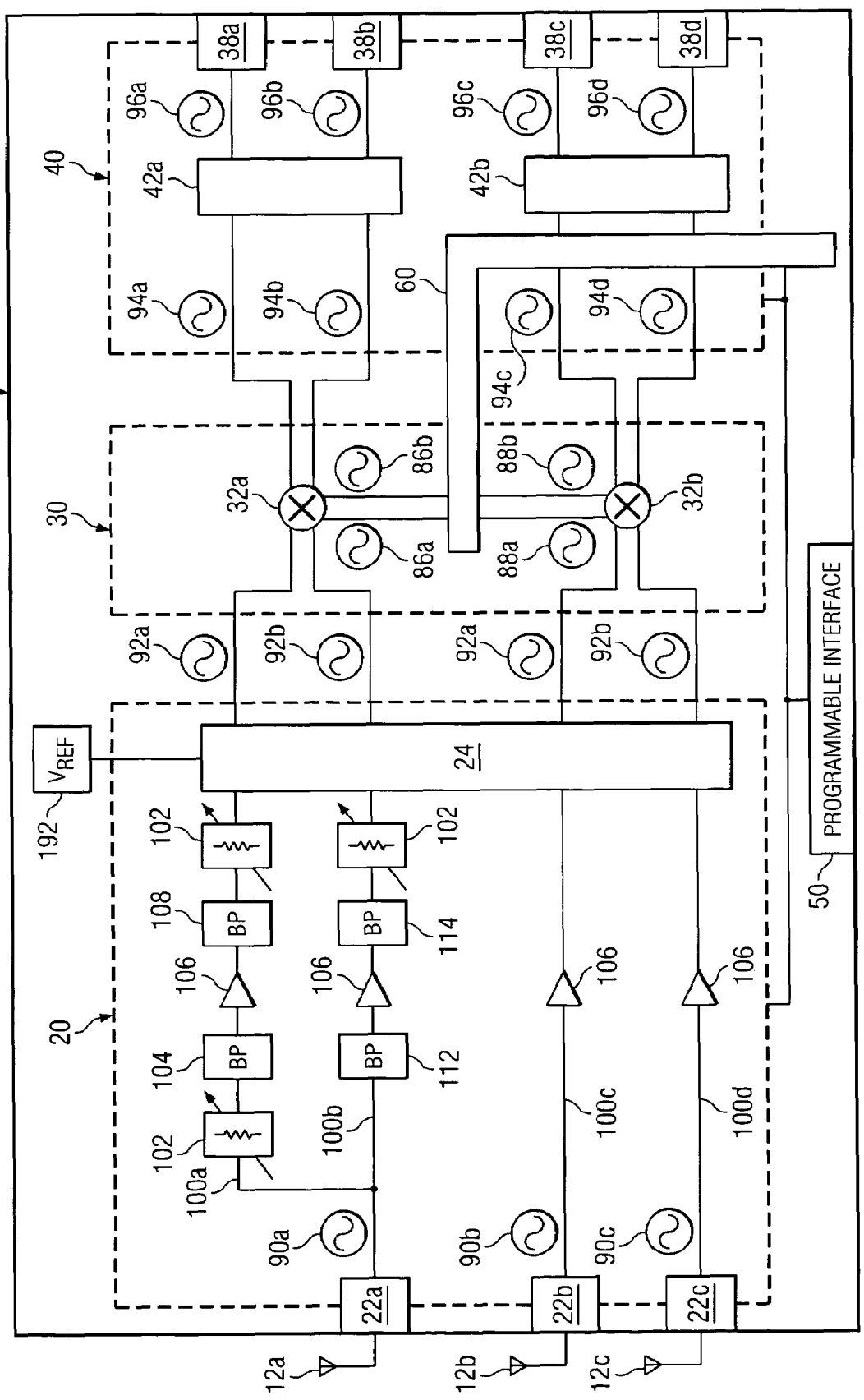
FIG. 1 illustrates a multi-band tuner according to a particular embodiment of the present invention.

FIG. 1 is a block diagram illustrating functional components of a particular embodiment of a tuner 10 capable of tuning radio-frequency signals received over multiple sub-bands of the radio-frequency spectrum. As shown in FIG. 1, tuner 10 includes a radio-frequency (RF) stage 20, a mixing stage 30, a baseband stage 40, a programmable interface 50, and a frequency generation circuit 60. Additionally, tuner 10 couples to a plurality of antennas 12 through which tuner 10 receives input signals 90. Tuner 10 isolates and outputs information within a particular range of frequencies, or "channel", selected by a user or another component coupled to tuner 10. In particular embodiments, tuner 10 is capable of tuning input signals 90 received within different sub-bands of varying size without substantial deterioration in performance. Additionally, in particular embodiments, based on the configuration of the various elements of tuner 10, tuner 10 may be capable of operating with low headroom and of limiting interference between internal signals used by the stages of tuner 10 as described in greater detail below.

Antennas 12 receive radio-frequency signals from terrestrial and/or satellite sources and transmit these signals to inputs ports 22 of tuner 10. Antennas 12 may represent and/or include any appropriate components to receive radio-frequency signals. In particular embodiments, tuner 10 is configured to receive signals in multiple bands of the radio-frequency spectrum, and tuner 10 may couple to a separate antenna 12 for each frequency band tuner 10 is capable of receiving. Although the description below focuses on embodiments in which tuner 10 receives input signals 90 through antennas 12, particular embodiments of system may omit antennas 12. In such embodiments, tuner 10 may receive input signals 90 from other components coupled to tuner 10 such as elements of an external cable transmission system.

In the illustrated embodiment, tuner 10 couples to an ultra high frequency (UHF) antenna 12a through which tuner 10 receives signals having a frequency within an appropriate portion of the UHF spectrum, a very high frequency (VHF) antenna 12b through which tuner 10 receives signals having a frequency within an appropriate portion of the VHF spectrum, and an L-band antenna 12c through which tuner 10 receives signals having a frequency within an appropriate portion of the L-Band. For example, particular embodiments of tuner 10 may be configured to receive signals within the 470 MHz to 2 GHz sub-band of the UHF spectrum from UHF antenna 12a, to receive signals within the 150 MHz to 260 MHz sub-band of the VHF spectrum form a VHF antenna 12b, and to receive signals within the 1.5 to 1.6 GHz sub-band of the L-Band spectrum from an L-Band antenna 12c. As a result, in particular embodiments, tuner 10 may be operable to receive signals within a wide sub-band from particular antennas 12 and within a narrow sub-band from the same or other antennas 12. Moreover, as described in greater detail below, tuner 10 may be capable of tuning across both the wide sub-bands and narrow sub-bands using a common mixer and/or other shared components.

RF stage 20 receives input signals 90 from input ports 22 and conditions input signals 90 to facilitate tuning of input signals 90 by baseband stage 40. RF stage 20 conditions input signals 90 in any appropriate manner based on the characteristics of the input signals 90 received by tuner 10 and the configuration of mixers 32 and/or other components of baseband stage 40. In the illustrated embodiment, RF stage 20 includes a plurality of input paths 100 connecting each of tuner input ports 22 to a signal converter 24. Nonetheless, RF stage 20 may include any appropriate number and configuration of components to perform the relevant signal-conditioning based on the input signals 90 received by tuner 10 and the characteristics and capabilities of the other components of tuner 10.

In the illustrated embodiment, RF stage 20 includes a plurality of input paths 100 connecting each of tuner input ports 22 to signal converter 24. Signal converter 24 couples one of input paths 100 to mixing stage 30 based on a frequency or channel selected by the user and/or other appropriate factors. Additionally, signal converter 24 may convert the input signals 90 received by RF stage 20 in an appropriate manner to facilitate the input of these signals to mixing stage 30. In particular embodiments, signal converter 24 may perform single-ended to differential conversion, voltage-mode to current-mode conversion, and/or any other suitable form of processing, conditioning, and/or conversion appropriate based on the configuration of tuner 10. Moreover, signal converter 24 may induce gain in the selected signal providing additional control over the signal strength and distortion characteristics of preprocessed signal 92.

To provide such signal conditioning, tuner 10 may include one or more input paths 100 containing various combinations of components capable of implementing the relevant conditioning. For example, as shown, first input path 100a includes a first attenuator 102, a first tunable bandpass filter 104, a low noise amplifier 106, a second tunable bandpass filter 108, and a second attenuator 102 that are connected in series and that couple tuner input port 22a to signal converter 24. Second input path 100b includes a third tunable bandpass filter 112, a low noise filter 106, a fourth tunable bandpass filter 114, and an attenuator 102 that are connected in series and that also couple tuner input port 22a to signal converter 24. Third input path 100c includes low noise amplifier 106 and couples tuner input port 22b to signal converter 24. Fourth input path 100d includes a low noise amplifier 106 that couples tuner input port 22c to signal converter 24.

The presence of attenuators 102 and bandpass filters 104 and 108 in input paths 100a and 100b may facilitate reception of input signals 90 across a wide sub-band through input paths 100a and 100b. As a result, in particular embodiments, RF stage 20 may include one or more input paths 100 (such as input paths 100a and 100b) configured for use with antennas 12 receiving signals across a wide sub-band and also one or more input paths 100 (such as input paths 100c and 100d) configured for use with antennas 12 receiving signals across a narrow sub-band. Moreover, because of the various configurations of input paths 100, tuner 10, in particular embodiments, may be capable of receiving and tuning broadband and/or narrowband input signals 90 that are transmitted over a very wide sub-band of the RF spectrum and also be capable of receiving and tuning broadband and/or narrowband input signals 90 that are received over a very narrow sub-band of the RF spectrum without substantial deterioration in performance. For example, in particular embodiments, tuner 10 may be capable of receiving and tuning signals transmitted over an approximately 1.5 GHz sub-band (from 470 MHz to 2 GHz) of the UHF band of the RF spectrum as well as receiving and tuning signals transmitted over an approximately 100 MHz sub-band (150 MHz to 260 MHz) of the VHF band of the RF spectrum without substantial deterioration of performance when tuning within either sub-band. Although these values are provided for purposes of illustration, tuner 10 may, in particular embodiments, be configured to allow tuning across any appropriately sized sub-bands of any portions of the RF spectrum.

Each of input paths 100 is operable to connect a particular tuner input port 22 to signal converter 24. Moreover, in particular embodiments, multiple input paths 100 may connect a particular tuner input port 22 to signal converter 24. In such embodiments, the multiple input paths 100 may each provide different forms of processing to the input signals 90 received by that tuner input port 22. For example, in the illustrated embodiment, both input paths 100a and 100b connect tuner input port 22a to signal converter 24. Based, in part, on the presence of the additional attenuator 102 in first input path 100a, first input path 100a, however, may be more tolerant of interference, while second input path 100b may allow for more robust frequency reception. Depending on strength of signal and/or other operational considerations, the user or tuner 10 itself may select an appropriate one of input path 100a and input path 100b to provide UHF signals to mixing stage 30. Furthermore, as described further below, gain and attenuation elements may be distributed throughout particular input paths 100 to allow tuner 10 to be configured for an optimal tradeoff between distortion and noise.

Signal converter 24 couples one of input paths 100 to mixing stage 30 based on a frequency or channel selected by the user and/or other appropriate factors. Thus, a user or other device controlling tuner 10 can select a particular input signal 90 and/or a particular form of processing to perform on the relevant input signal 90 by controlling the operation of signal converter 24.

Additionally, signal converter 24 may convert the input signals 90 received by RF stage 20 in an appropriate manner to facilitate the input of these signals to mixing stage 30. Signal converter 24 then outputs the selected input signal 90 as one or more preprocessed signals 92. In particular embodiments, signal converter 24 converts single-ended, voltage-mode input signals 90 received by tuner 10 into a differential pair of current-mode preprocessed signals (92a and 92b). Moreover, signal converter 24 may induce gain in the selected signal providing additional control over the signal strength and distortion characteristics of preprocessed signals 92.

Furthermore, in particular embodiments, tuner 10 may be housed in a single integrated circuit and signal converter 24 may be coupled to a single reference voltage 192 provided by components internal and/or external to tuner 10 for multiple bands. Reference voltage 192 may be provided by any appropriate component or collection of components. In particular embodiments, reference voltage 192 is provided by a charged capacitor. In general however, reference voltage 192 may be provided by any other component or components capable of providing a voltage having the desired electrical characteristics. By utilizing reference voltage 192 produced by the same component or components to effectuate the single-ended-to-differential conversion of multiple input signals 90, tuner 10 may reduce the number of external components necessary to operate tuner 10 and/or the amount of silicon space required for the internal components of tuner 10. This may result in both size and cost savings.

Returning to the components of tuner 10, mixing stage 30 downconverts preprocessed signal 92 based on the selected tuning frequency and outputs a downconverted signal 94. In the illustrated embodiment, mixing stage 30 includes a pair of mixers 32a and 32b. More specifically, mixer 30 includes an in-phase mixer 32a and a quadrature mixer 32b. Mixing stage 30 may, however include any appropriate number and configuration of components to downconvert a selected portion of the received preprocessed signal 92. The contents of a particular embodiment of mixing stage 30 are described in greater detail below with respect to FIGS. 2A and 2B.

Baseband stage 40 receives downconverted signal 94 from mixing stage 30, isolates the baseband portion of downconverted signal 94, and generates one or more output signals 96 that include the baseband portion of downconverted signal 94. Tuner 10 then outputs, at one or more output pins 38, an output signal 96 that contains the baseband portion of the downconverted signal. In particular embodiments, output pins 38 may couple to a demodulator or other appropriate component for subsequent processing and/or use of output signals 96. In the illustrated embodiment, baseband stage 40 includes a pair of baseband filters 42. Although the filters included in baseband stage 40 are described as "baseband" filters, particular embodiments of tuner 10 may include any suitable type of filters appropriate based on the configuration of tuner 10. Moreover, although baseband stage 40, as illustrated, includes particular components, baseband stage 40 may include any appropriate number and configuration of components to downconvert a selected portion of the received preprocessed signal 92 and/or isolate the baseband portion of the downconverted signal 94.

Frequency generation circuit 60 generates one or more periodic signals for use by mixing stage 30 to downconvert preprocessed signals 92 received by mixing stage 30. In particular embodiments, frequency generation circuit 60 may include one or more frequency dividers located near mixing stage 30 to adjust the frequency of the generated periodic signal to a frequency useable by mixing stage 30. The placement of such frequency dividers may provide additional advantages for particular embodiments of tuner 10 as described in greater detail below with respect to FIG. 3.

In operation, RF stage 20 receives input signals 90 at input ports 22. RF stage 20 may receive input signals 90 from any appropriate sources. In particular embodiments, RF stage 20 may couple to a plurality of antennas (not shown) through input ports 22, and input signals 90 may represent signals received by these antennas and transmitted to input ports 22. After being received at input ports 22, input signals 90 propagate over input paths 100 to signal converter 24.

Based on the input received from programmable interface 50, signal converter 24 selects a particular input path 100 to output. Depending on the configuration of tuner 10, signal converter 24 may, by selecting a particular input path 100 to output, select the source from which tuner 10 receives the input signal. For example, in the illustrated embodiment, signal converter 24 may, by selecting between input paths 100b-d, select between input signals 90 received at input ports 22a-c respectively. Additionally, in particular embodiments, multiple input paths 100 may couple a particular input port 22 to signal converter 24. In such embodiments, signal converter 24 may also, by selecting a particular input path 100, select the conditioning to be performed to the selected input signal 90. For example, in the illustrated embodiment, both input paths 100a and 100b couple input port 22a to signal converter 24 but, as a result of the different components included in input paths 100a and 100b, the two input paths 100 condition input signals 90 received at input port 22a in different manners. As a result, tuner 10 may be reconfigured dynamically to adjust to changes in operating conditions or performance requirements.

In particular embodiments, signal converter 24 may also convert the selected input signal 90 from a single-ended signal to a differential signal pair and/or from a voltage-mode signal to a current-mode signal. Because low noise amplifiers 106 in the various input paths 100 amplify input signals 90 before they are converted, RF stage 20 may provide several advantages. For example, by amplifying input signals 90 prior to voltage-to-current conversion, particular embodiments of RF stage 20 may limit the current consumption by tuner 10. Moreover, by amplifying input signals 90, prior to converting them from single-ended signals to differential signal pairs, particular embodiments of RF stage 20 may produce improved noise figures. Additionally, by converting input signals 90 to differential signals before transmitting input signals 90 to mixer 30, tuner 10 may achieve better even-order distortion performance.

After any appropriate conversion and amplification, signal converter 22 outputs the selected input signal 90 to baseband stage 40 as preprocessed signal 92. In particular embodiments, signal converter outputs two copies of preprocessed signals 92. In the illustrated embodiment, each copy of preprocessed signal 92 represents a current-mode, differential signal pair (92a and 92b).

Mixers 32a and 32b of baseband stage 40 each receive a copy of preprocessed signal 92. As described in greater detail below with respect to FIG. 3, frequency generation circuit 60 provides mixers 32a and 32b with a tuning signal 86 and a phase-shifted version of tuning signal 86, referred to as phase-shifted tuning signal 88, both having a frequency equal to the selected tuning frequency. Based on tuning signal 86 and phase-shifted tuning signal 88, respectively, mixers 32a and 32b downconvert a particular frequency component or channel within preprocessed signal 92 so that the relevant frequency or channel possesses a lower center frequency. More specifically, mixers 32a and 32b downconvert the relevant frequency component or channel so that the relevant frequency component or channel is centered at the desired baseband frequency. In particular embodiments, this frequency may be substantially near 1 Hz. After downconversion, preprocessed signals 92 are output by mixers 32a and 32b as downconverted signals 94. More specifically, in the illustrated embodiment, mixers 32a and 32b output downconverted signal 94 as an in-phase downconverted signal pair 94a and 94b and a quadrature downconverted signal pair 94c and 94d.

Baseband stage 40 receives downconverted signals 94 output by mixing stage 30. Baseband filters 42 in baseband stage 40 attenuate and/or filter out high-frequency components of the downconverted signal to produce an output that includes the component of the selected input signal 90 that was transmitted within the selected channel. In the illustrated embodiment, baseband filters 42 each provide this output as a pair of differential output signals (96a and 96b) at output ports 38. In particular embodiments, baseband filters 42 may be configured to have a passband that is sized based on the minimum channel-spacing used in the signals received at input ports 22. These tuned output signals 96 may, in particular embodiments, represent a pair of quadrature, differential signals.

Because particular embodiments of tuner 10 may be designed for use in portable devices or other devices having space and power restrictions, the configuration and contents of baseband stage 40 may provide one or more operational benefits in generating tuned output signals 96. As one example, the use of a folded cascode to couple mixers 32a and 32b to baseband filters 42a and 42b, respectively, may allow tuner 10 to operate with low headroom as described in greater below with respect to FIGS. 2A-2B. As another example, the contents and configuration of frequency generation circuit 60 may reduce interference between tuning signals 86 and 88 generated by frequency generation circuit and other signals traversing tuner 10, as described in greater detail below in FIG. 3.

Figure 2A:
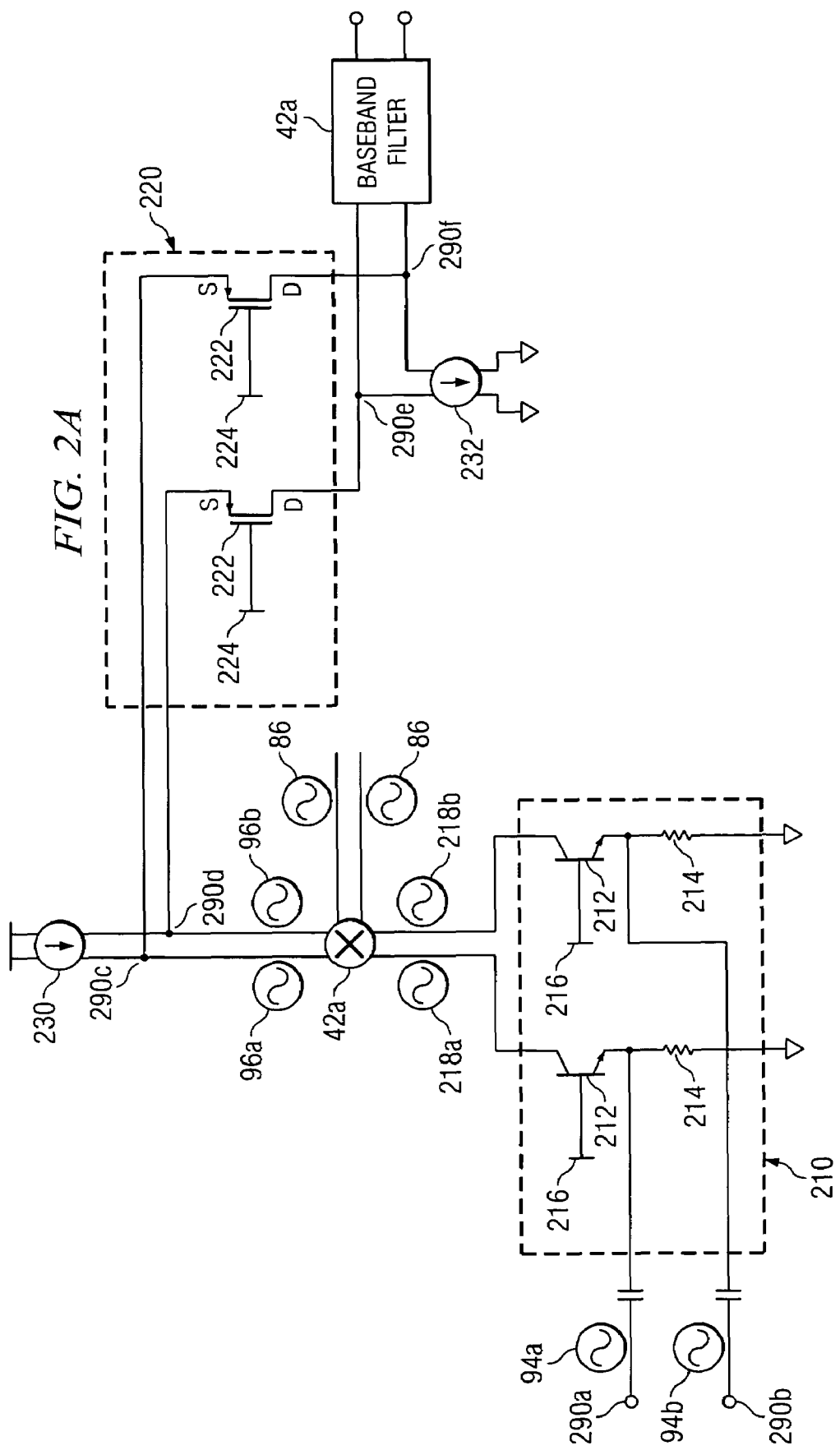

FIGS. 2A and 2B illustrate a detailed view of particular portions of baseband stage 40 according to a particular embodiment. Shown in FIG. 2A are example embodiments of mixer 32a and baseband filter 42 that were introduced above with respect to FIG. 1. Additionally, FIG. 2A also illustrates a modulated current source 210, constant current sources 230 and 232, and a folded cascode 220. Although FIG. 2A and the associated text describe, for the purposes of simplicity, only the portion of baseband stage 40 associated with mixer 32a, the portion of baseband stage 40 that is associated with mixer 32b may, with appropriate modifications, use a similar configuration, as illustrated by FIG. 2B.

Modulated current source 210 receives preprocessed signal 92 from signal converter 24 of RF stage 20 and modulates, based on the preprocessed signal 92, a reference current that is produced by modulated current source 210. More specifically, in particular embodiments, modulated current source 210 outputs a modulated current signal 218 representing the sum of the preprocessed signal 92 and the reference current. In particular embodiments, modulated current source 210 may receive preprocessed signal 92 as a differential signal and may also output modulated current signal 218 as a differential signal pair (218a and 218b) as shown in FIG. 2A.

Modulated current source 210, in the illustrated embodiment, includes a pair of bipolar transistors (BJT) 212 and a pair of resistors 214 for receiving the positive and the negative portion of the differential preprocessed signal 92. The emitter of each BJT 212 is coupled to ground through the corresponding resistor 214. Additionally, the base of each BJT 212 is coupled to an appropriate biasing voltage 216. In general, however, modulated current source 210 may include any appropriate components suitable to provide the described functionality. As one example, although the illustrated embodiments of modulated current source 210 includes BJT 212, modulated current source 210 may include any appropriate form of transistors instead of or in addition to BJTs 212.

Folded cascode 220 provides a low-impedance path for downconverted signal 94 between mixer 32a and baseband filter 42a. In the illustrated embodiment, folded cascode 220 is configured to receive downconverted signal 94 as a differential signal pair (94a and 94b) applied to the source of two field-effect transistors (FETs) (222a and 222b, respectively). FETs 222 are each biased by an appropriate biasing voltage 224. In general, however, folded cascode 220 may represent any appropriately configured cascode 220 coupling mixer 32a and baseband filter 42a.

Constant current sources 230 and 232 supply a fixed output current. More specifically, in the illustrated embodiment, constant current sources 230 and 232 are each capable of producing a constant differential current-mode signal. In general, however, constant current sources 230 and 232 may each include any appropriate components suitable to provide the described functionality, and may include identical or differing components.

In operation, baseband stage 40 receives preprocessed signal 92 across nodes 290a and 290b. Baseband stage 40 uses the received preprocessed signal 92 to modulate the output of modulated current source 210. As a result, modulated current source 210 outputs a modulated current signal 218 that includes information from preprocessed signal 92. In particular embodiments, modulated current signal 218 represents a sum of preprocessed signal 92 and a reference current signal generated by modulated current source 210. Modulated current signal 218 is transmitted to mixer 32a.

Based on a tuning signal 86 received from frequency generation circuit 60, mixer 32a downconverts a portion of modulated current signal 218 that is associated with a selected channel. Particular embodiments of mixer 32 may utilize a tuning signal 86 that is generated as described below with respect to FIG. 3. Mixer 32 then outputs the downconverted information as downconverted signals 94a and 94b, a differential signal pair. As a result, information that was transmitted in the selected channel is output as a baseband component of downconverted signals 94.

At nodes 290c and 290d, downconverted signals 94 are routed towards folded cascode 220 as a result of the relatively higher input impedance of constant current source 230 by comparison to that of folded cascode 220. Downconverted signal 94 is then routed through folded cascode 220 to nodes 290e and 290f. At nodes 290e and 290f, downconverted signals 94 are routed into baseband filter 42a as a result of the relatively higher input impedance of constant current source 232 by comparison to baseband filter 42a.

Baseband filter 42a filters downconverted signals 94, attenuating a portion of the downconverted signals 94 that is outside a particular passband associated with baseband filter 42a. Baseband filter 42a outputs the filtered downconverted signals 94 as output signals 96, which may also represent a differential signal pair. In particular embodiments, baseband filter 42a may induce a gain in downconverted signal 94 that is reflected in output signal 96. Additionally, in particular embodiments, baseband filter 42a may convert downconverted signals 94 from current-mode signals to voltage-mode signals.

As a result of the folded cascode 220 conveying downconverted signal 94 from the output of mixer 32 and into the input of baseband filter 42a, baseband stage 40 may be able to operate with reduced headroom. More specifically, the low-impedance output path provided by folded cascode 220 allows particular embodiments of tuner 10 to operate with only 2.5 V headroom. Moreover, as a result of this low headroom requirement, particular embodiments of tuner 10 may draw less power while operating and be capable of operating with a lower-voltage battery. Additionally, because of the use of modulated current source 210 to feed the signal received by baseband stage 40 into mixer 32a, baseband stage 40 may electronically isolate tuning signal 86 from preprocessed signal 92, resulting in better overall noise figures for tuner 10. Thus, certain embodiments of baseband stage 40 may provide multiple operational benefits. However, particular embodiments may provide some, none, or all of these benefits.

Figure 3:
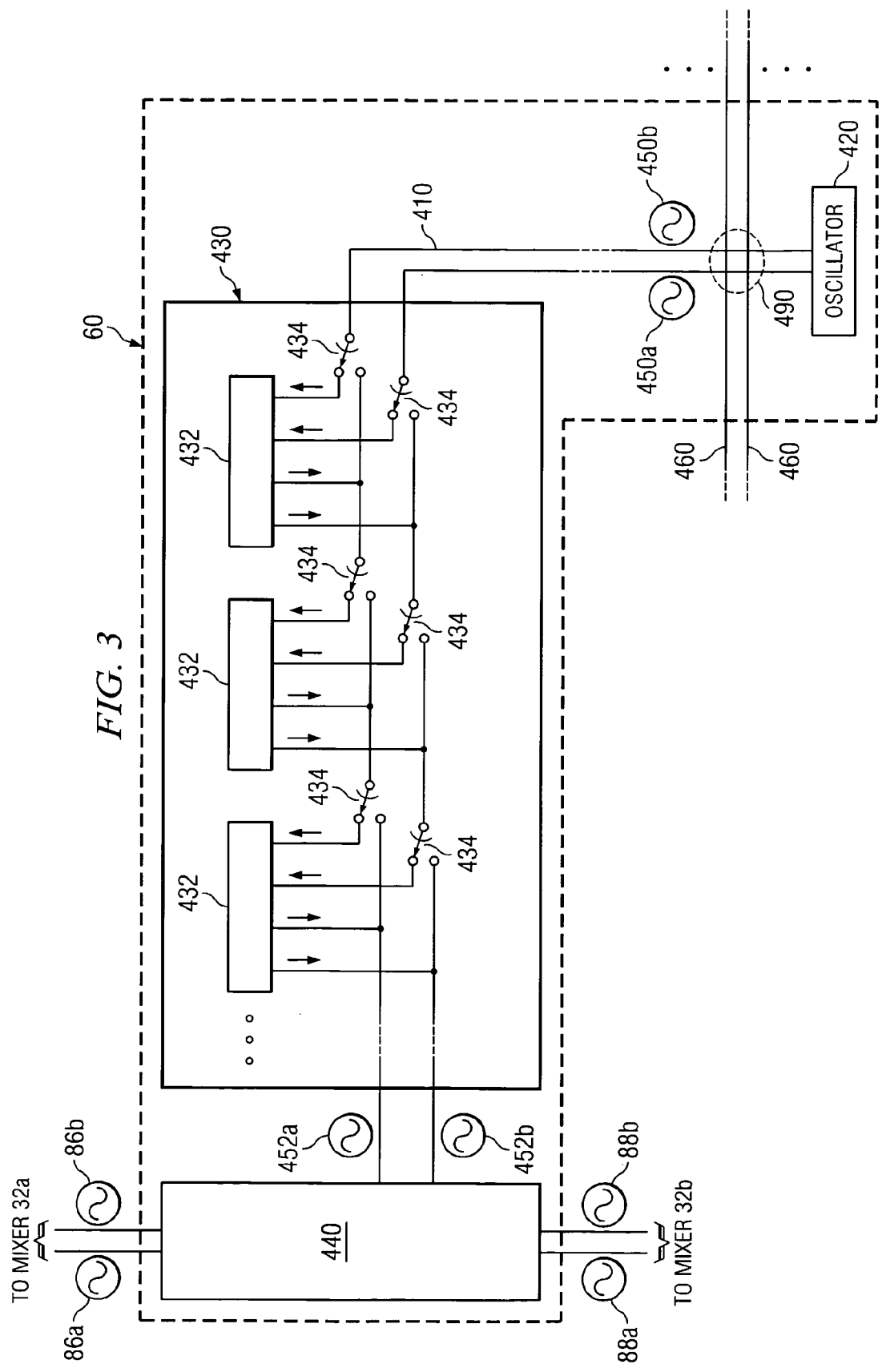
FIG. 3 is a detailed illustration of a frequency generation circuit that may be utilized in a particular embodiment of the multi-band tuner.

FIG. 3 illustrates the configuration and operation of particular embodiments of frequency generation circuit 60. As noted above, frequency generation circuit 60 generates tuning signal 86 and phase-shifted tuning signal 88, which are used by mixers 32 in downconverting preprocessed signal 92. Although FIG. 1 illustrates an embodiment of frequency generation circuit 60 in use with a particular embodiment of tuner 10, frequency generation circuit 60 may be used independently of the tuner 10 shown in FIG. 1. The illustrated embodiment of frequency generation circuit 60 generates signals for use by mixers 32 and transmits these signals to mixers 32 along a frequency generation path 410. In particular embodiments, frequency generation path 410 couples an oscillator 420, a frequency divider 430, and quadrature generator 440.

Oscillator 420 generates oscillator signal 450, a periodic signal generated at a particular frequency that is determined based on the frequency of the signal to be downconverted by mixers 32. In the illustrated embodiment, oscillator 420 generates oscillator signal 450 as a differential signal pair (450a and 450b). Oscillator 420 may comprise all or a portion of a frequency synthesizer using a phase-locked loop (PLL). In particular embodiments, oscillator 420 may be capable of producing tuning signals in a frequency range much higher than that of the input signals 90 received by tuner 10.

Frequency divider 430 divides the frequency of oscillator signal 450 by some factor (referred to here as a "divisor") resulting in a divided oscillator signal 452. For example, in particular embodiments, frequency divider 430 may be capable of dividing the frequency of oscillator signal 450 by a divisor equal to any multiple of two from two to N (for example, in particular embodiments, N equals 32). As a result of this flexibility, such embodiments of tuner 10 may be capable of tuning channels received in several different bands of the radio-frequency spectrum. In general, however, frequency divider 430 may include any appropriate combination of components suitable to divide the frequency of oscillator signal 450 by any appropriate divisor or divisors.

In the illustrated embodiment, frequency divider 430 includes a plurality of divider cells 432 and a plurality of switches 434. Divider cells 432 each divide the frequency of the signal received by that divider cell 432. Switches 434 are each capable of switching one or more divider cells 432 into frequency generation path 410. Because each divider cell 432 may be configured to divide the frequency of the signal received by that divider cell 432 by a particular divisor, the final frequency of the signal received by quadrature generator 440 may be adjusted by switching divider cells 432 in and out of frequency generation path 410.

Quadrature generator 440 receives divided oscillator signal 452 from frequency divider 430 and induces a ninety-degree (90°) phase shift in the received signal. Quadrature generator 440 then outputs a copy of the received divided oscillator signal 452 as tuning signal 86 (as shown in FIG. 1) and the phase-shifted copy of divided oscillator signal 452 as phase-shifted tuning signal 88 (as also shown in FIG. 1). Quadrature generator 440 may include any appropriate collection of components suitable to induce a phase shift in divided tuning signal 450.

In addition to frequency generation circuit 60, FIG. 3 also shows a plurality of conductive paths 460 that carry signals across all or portions of tuner 10. For the purposes of this description and the claims that follow, "conductive path" may represent any path capable of propagating an input signal 90, preprocessed signal 92, downconverted signal 94, output signal 96, reference signal, biasing signal, supply voltage, and/or any other appropriate voltage or current back to an input of mixing stage 30. In particular embodiments, conductive paths 460 may include some or all of input paths 100, shown in FIG. 1. Furthermore, in particular embodiments, due to the layout of tuner 10 and the location of particular elements of tuner 10, frequency generation path 410 crosses one or more conductive paths 460 and/or the physical path traced by frequency generation path 410 comes sufficiently close to conductive paths 460 for the oscillator signal 450 to couple into signals that are propagating on conductive paths 460 at the same or approximately the same frequencies. Thus, as described further below, in particular embodiments, the elements of frequency generation circuit 60 may be positioned so as to reduce and/or eliminate such interference.

In operation, oscillator 420 generates oscillator signal 450 and transmits oscillator signal 450 down frequency generation path 410. In particular embodiments, the frequency of oscillator signal 450 is set by a user or another component coupled to tuner 10 and communicated to oscillator 420 through a programmable interface (not shown). Moreover, the frequency communicated to oscillator 420 may be selected by the user or the appropriate component based on a selected frequency associated with a particular channel of information in input signal 90 that tuner 10 is being requested to tune. In particular embodiments, the frequency of oscillator signal 450 generated by oscillator 420 is a multiple of the selected frequency.

As oscillator signal 450 traverses frequency generation path 410, oscillator signal 450 may cross one or more conductive paths 460 and/or propagate sufficiently close to one or more conductive paths 460. For example, in the illustrated embodiment, frequency generation path 410 crosses conductive paths 460 at least at point 490. Signals propagating on conductive paths 460 couple into signals traversing frequency generation path if the signals traversing frequency generation path 410 are propagating at the same or approximately the same frequency as the signals traversing conductive paths 460. To avoid this problem and/or to reduce its effect, particular embodiments of frequency generation circuit 60, may utilize an embodiment of oscillator 420 that generates an oscillator signal 450 having a frequency substantially greater than input signals 90 and other signals that propagate across tuner 10. As a result, this may reduce and/or prevent interference between oscillator signal 450 and other signals propagating across tuner 10.

Frequency divider 430 receives oscillator signal 450 and, depending on the selected frequency, may divide oscillator signal 450 to produce a tuning signal 86 having a frequency the same or approximately the same as the selected frequency. In the illustrated embodiment, frequency generation circuit 60 may select one or more switches 434 to switch so that a particular number of divider cells 432 are included in frequency generation path 410. Frequency divider 430 outputs divided oscillator signal 452 to quadrature generator 440. Depending on the number of divider cells 432 switched into the frequency generation path 410, frequency divider 430 outputs a divided oscillator signal 452 with a frequency equal to the frequency of oscillator signal 450 divided by some divisor. For example, in particular embodiments, divider cells 432 may each be configured to divide by two the frequency of the signal received by the divider cell 432. As a result, frequency divider 430 may divide the frequency of oscillator signal 450 by some multiple of two that is determined by the number of divider cells 432 that frequency divider 430 has switched into frequency generation path 410.

Quadrature generator 440 receives divided oscillator signal 452 from frequency divider 430. Quadrature generator 440 time shifts a copy of divided oscillator signal 452. Quadrature generator 440 then outputs divided oscillator signal 452 as tuning signal 86 and the time-shifted copy of divided oscillator signal 452 as phase-shifted tuning signal 88. Mixer 30 uses tuning signal 86 and phase-shifted tuning signal 88 to downconvert preprocessed signal 92 and output downconverted signals 94 as described above with respect to FIGS. 1 and 2A-2B.

Thus, in particular embodiments of frequency generation circuit, frequency divider and/or divider cells 432 are located on frequency generation path 410 in a manner such that, wherever frequency generation path 410 is sufficiently close to conductive paths 460 to induce noise in oscillator signal, oscillator signal 450 propagates at a higher frequency than input signals 90, preprocessed signals 92, downconverted signals 94, output signals 96, and/or other appropriate signals traversing conductive paths 460. Consequently, frequency generation circuit 60 may reduce and/or eliminate the noise oscillator signal 450 induces in particular frequency components of the signals propagating on conductive paths 460. Thus, particular embodiments of tuner 10 may include embodiments of frequency generation circuit 60 that provide multiple advantages. Particular embodiments of tuner 10, however, may provide some, none, or all of these advantages.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A system for tuning a radio-frequency signal, comprising:
a first input path operable to propagate a first single-ended voltage-mode input signal to a selector;
a second input path operable to propagate a second single-ended voltage-mode input signal to the selector;
a common reference generator operable to generate a reference signal;
a selector operable to:
convert the first single-ended voltage-mode input signal to a first differential current-mode input signal using the common reference signal;
convert the second single-ended voltage-mode input signal to a second differential current-mode input signal using the common reference signal;
selectively couple one of the first input path and the second input path to an input of a mixer;
the mixer operable to:
receive a selected one of the first differential current-mode input signal and the second differential current-mode input signal from the selector;
downconvert at least a portion of the selected input signal; and
output the downconverted input signal;
the filter operable to:
receive the downconverted input signal;
attenuate a portion of the downconverted input signal that is outside a passband associated with the filter; and
output at least a portion of the downconverted signal that is within the passband associated with the filter.

2. The system of claim 1, wherein:
the first single-ended input signal is associated with a first portion of a radio-frequency spectrum;
the second single-ended input signal is associated with a second portion of the radio-frequency spectrum; and
the first portion of the radio-frequency spectrum is greater than the second portion of the radio-frequency spectrum.

3. The system of claim 2, wherein the first portion of the radio-frequency spectrum comprises at least a portion of the very high frequency (VHF) spectrum.

4. The system of claim 2, wherein the first portion of the radio-frequency spectrum comprises at least a portion of the ultra high frequency (UHF) spectrum.

5. The system of claim 2, wherein the second portion of the radio-frequency spectrum comprises at least a portion of the L-band.

6. The system of claim 1, wherein:
the mixer comprises a first mixer;
the filter comprises a first filter; and further comprising:
a second mixer operable to:
receive the selected differential input signal from the selector;
shift a phase associated with the selected differential input signal;
downconvert at least a portion of the phase-shifted input signal; and
output the downconverted phase-shifted input signal;
the second filter operable to:
receive the downconverted phase-shifted input signal from the second mixer;
attenuate a portion of the downconverted phase-shifted input signal that is outside a passband associated with the second filter; and
output at least a portion of the downconverted phase-shifted input signal that is within the passband associated with the second filter.

7. A system for receiving radio-frequency signals comprising:
a conductive path operable to couple at least one of a voltage and a current to an input of a mixer, wherein the at least one of the voltage and the current is associated with one or more frequencies within a first range of frequencies;

an oscillator operable to generate an oscillator signal wherein the oscillator signal is associated with a frequency within a second range of frequencies;

a tuning path operable to couple the oscillator signal to a tuning input of the mixer, wherein the tuning path crosses the conductive path at least at a first point;

a frequency divider located on the tuning path between the first point and the tuning input of the mixer and operable to generate a divided oscillator signal based on the oscillator signal, and wherein the divided oscillator signal is associated with a frequency within the first range of frequencies; and the mixer operable to:
receive, at the signal input of the mixer, the input signal from the conductive path;
receive, at the tuning input of the mixer, the divided oscillator signal from the tuning path;
downconvert the input signal based on the divided oscillator signal; and
output at least a portion of the downconverted input signal.

8. The system of claim 7, wherein the frequency divider comprises:
a switch operable to switch a divider cell into the tuning path; and
the divider cell operable, when switched into the tuning path, to generate the divided oscillator signal by dividing the frequency associated with the oscillator signal.

9. The system of claim 7, wherein the frequency divider is associated with a set of divisors and operable to divide the frequency associated with the oscillator signal by any of the divisors in the set of divisors.

10. The system of claim 9, wherein the frequency divider comprises:
a plurality of switches, each switch operable to switch one or more of a plurality of divider cells into the tuning path; and
the plurality of divider cells, and wherein the frequency divider is operable to divide the frequency of the oscillator signal by one of the divisors in the set of divisors by switching a number of divider cells associated with that divisor into the tuning path.

11. The system of claim 7, wherein the mixer comprises a first mixer; and further comprising:
a quadrature generator operable to generate a phase-shifted oscillator signal by shifting a phase associated with a copy of the divided oscillator signal; and
a second mixer operable to:
receive the input signal;
shift a phase associated with the input signal;
downconvert at least a portion of the phase-shifted input signal, based on the phase-shifted oscillator signal; and
output the downconverted phase-shifted oscillator signal.

12. The system of claim 7, wherein the tuning path crosses the conductive path at a plurality of points, and wherein the first point comprises a particular one of the plurality of points closest to the tuning input of the mixer.

13. A method for tuning a radio-frequency signal, comprising:
receiving, at a first input, a first single-ended voltage-mode input signal, wherein the first input is coupled to a selector by a first input path;

receiving, at a second input, a second single-ended voltage-mode input signal, wherein the second input is coupled to the selector by a second input path;

generating, at a common reference generator, a reference signal converting the first single-ended voltage-mode input signal to a first differential current-mode input signal using the reference signal;

converting the second single-ended voltage-mode input signal to a second differential current-mode input signal using the reference signal;

coupling a selected one of the first input path and the second input path to an input of a mixer;

downconverting at least a portion of a selected one of the first differential current-mode input signal and the second differential current-mode input signal;

attenuating a portion of the downconverted input signal that is outside a passband associated with the filter; and outputting at least a portion of the downconverted input signal that is within the passband associated with the filter.

14. The method of claim 13, wherein:
receiving the first single-ended input signal comprises receiving a first input signal associated with a first portion of a radio-frequency spectrum; and
receiving the second single-ended input signal comprises receiving a second input signal associated with a second portion of the radio-frequency spectrum.

15. The method of claim 14, wherein the first portion of the radio-frequency spectrum comprises at least a portion of the very high frequency (VHF) spectrum.

16. The method of claim 14, wherein the first portion of the radio-frequency spectrum comprises at least a portion of the ultra high frequency (UHF) spectrum.

17. The method of claim 14, wherein the second portion of the radio-frequency spectrum comprises at least a portion of the L-band.

18. The method of claim 13, wherein:
the mixer comprises a first mixer;
the filter comprises a first filter; and
coupling the selected one of the first input path and the second input path to the input of the mixer comprises coupling the selected input path to the input of the first mixer and an input of a second mixer; and further comprising:
shifting a phase associated with the selected one of the first differential input signal and the second differential input signal;
downconverting at least a portion of the phase-shifted input signal;
attenuating a portion of the downconverted phase-shifted input signal that is outside a passband associated with the second filter; and
outputting at least a portion of the downconverted phase-shifted input signal that is within the passband associated with the second filter.

19. A system for tuning a radio-frequency signal, comprising:
means for receiving a first single-ended voltage-mode input signal, wherein the first input is coupled to a selector by a first input path;
means for receiving a second single-ended voltage-mode input signal, wherein the second input is coupled to the selector by a second input path;
means for generating a reference signal means for converting the first single-ended voltage-mode input signal to a first differential current-mode input signal using the reference signal;

means for converting the second single-ended voltage-mode input signal to a second differential current-mode input signal using the reference signal;

means for coupling a selected one of the first input path and the second input path to an input of a mixer;

means for downconverting at least a portion of a selected one of the first differential current-mode input signal and the second differential current-mode input signal;

means for attenuating a portion of the downconverted input signal that is outside a passband associated with the filter; and means for outputting at least a portion of the downconverted input signal that is within the passband associated with the filter.

20. The system of claim 19, wherein:

the means for receiving the first single-ended input signal comprises means for receiving a first input signal associated with a first portion of a radio-frequency spectrum; and the means for receiving the second single-ended input signal comprises means for receiving a second input signal associated with a second portion of the radio-frequency spectrum.

21. The system of claim 20, wherein the first portion of the radio-frequency spectrum comprises at least a portion of the very high frequency (VHF) spectrum.

22. The system of claim 20, wherein the first portion of the radio-frequency spectrum comprises at least a portion of the ultra high frequency (UHF) spectrum.

23. The system of claim 20, wherein the second portion of the radio-frequency spectrum comprises at least a portion of the L-band.

24. The system of claim 19, wherein:

the mixer comprises a first mixer;

the filter comprises a first filter; and the means for coupling the selected one of the first input path and the second input path to the input of the mixer comprises means for coupling the selected input path to the input of the first mixer and an input of a second mixer; and further comprising:

means for shifting a phase associated with the selected one of the first differential input signal and the second differential input signal;

means for downconverting at least a portion of the phase-shifted input signal;

means for attenuating a portion of the downconverted phase-shifted input signal that is outside a passband associated with the second filter; and means for outputting at least a portion of the downconverted phase-shifted input signal that is within the passband associated with the second filter.

* * * * *